United States Patent
Huff et al.

(10) Patent No.: US 11,101,527 B2
(45) Date of Patent: Aug. 24, 2021

(54) METHOD OF ASSEMBLY OF A BATTERY MODULE WITH UNIFIED CONNECTION ARRAY

(71) Applicant: Artisan Vehicle Systems Inc., Camarillo, CA (US)

(72) Inventors: Brian R. Huff, Newbury Park, CA (US); Michael E. Kasaba, Malibu, CA (US); Kyle Hickey, Moorpark, CA (US)

(73) Assignee: Artisan Vehicle Systems Inc., Camarillo, CA (US)

( * ) Notice: Subject to any disclaimer, the term of this patent is extended or adjusted under 35 U.S.C. 154(b) by 0 days.

(21) Appl. No.: 16/893,782

(22) Filed: Jun. 5, 2020

(65) Prior Publication Data

US 2020/0303711 A1  Sep. 24, 2020

Related U.S. Application Data

(62) Division of application No. 15/712,117, filed on Sep. 21, 2017, now Pat. No. 10,749,161.

(60) Provisional application No. 62/398,957, filed on Sep. 23, 2016.

(51) Int. Cl.
| | |
|---|---|
| *H01M 10/42* | (2006.01) |
| *H01M 50/502* | (2021.01) |
| *H01M 10/48* | (2006.01) |
| *H01M 50/20* | (2021.01) |

(52) U.S. Cl.
CPC ..... *H01M 50/502* (2021.01); *H01M 10/4257* (2013.01); *H01M 10/482* (2013.01); *H01M 50/20* (2021.01); *H01M 2220/20* (2013.01)

(58) Field of Classification Search
CPC .. H01M 50/502; H01M 50/20; H01M 10/482; H01M 10/4257; H01M 2220/20; H01M 2010/4278; H01M 2010/4271; H01M 10/425; H01M 10/637; H01M 10/486; Y02E 60/10; H05K 2201/10272; H05K 2201/10037; H05K 2203/167;
(Continued)

(56) References Cited

U.S. PATENT DOCUMENTS

| | | | |
|---|---|---|---|
| 8,920,955 B1* | 12/2014 | Chuang | H01M 50/502 429/99 |
| 9,023,499 B2 | 5/2015 | Takase | |
| 2005/0077878 A1 | 4/2005 | Carrier et al. | |

(Continued)

FOREIGN PATENT DOCUMENTS

JP  2015-118731 A  6/2015

OTHER PUBLICATIONS

International Search Report and Written Opinion dated Jan. 9, 2018 for International Patent Application No. PCT/US2017/052928.
(Continued)

*Primary Examiner* — Michael L Dignan
(74) *Attorney, Agent, or Firm* — Plumsea Law Group, LLC

(57) ABSTRACT

A method for assembling a battery module including a unified connection array with a flexible connector is described. The flexible connector can include a plurality of pads that are secured to a central spine. The flexible connector may be a single piece connector. The flexible connector can include monitors that are mounted to the flexible connector to gather data regarding battery cells of the battery module.

20 Claims, 14 Drawing Sheets

(58) Field of Classification Search
CPC .. H05K 2201/052; H05K 3/365; H05K 1/189; H05K 3/326; H05K 2010/4278
See application file for complete search history.

(56) References Cited

U.S. PATENT DOCUMENTS

| | | | |
|---|---|---|---|
| 2010/0248008 A1 | 9/2010 | Sugawara et al. | |
| 2011/0076521 A1 | 3/2011 | Shimizu et al. | |
| 2011/0091749 A1* | 4/2011 | Chow | H01M 50/35 429/50 |
| 2011/0151315 A1* | 6/2011 | Masson | H01M 10/486 429/159 |
| 2012/0328920 A1 | 12/2012 | Takase et al. | |
| 2013/0178091 A1* | 7/2013 | Ogasawara | H01M 50/20 439/366 |
| 2013/0234511 A1* | 9/2013 | Murata | H01M 10/482 307/10.1 |
| 2013/0302651 A1 | 11/2013 | Hyun-Joong et al. | |
| 2014/0370343 A1 | 12/2014 | Nomoto et al. | |
| 2015/0072211 A1* | 3/2015 | Nakamura | H01M 50/502 429/121 |
| 2015/0086825 A1 | 3/2015 | Huff et al. | |
| 2015/0263394 A1* | 9/2015 | Yoshioka | H01M 10/425 429/90 |
| 2015/0340744 A1 | 11/2015 | Knobloch et al. | |
| 2016/0133908 A1 | 5/2016 | Zhao | |
| 2016/0301049 A1 | 10/2016 | Zhu et al. | |
| 2016/0336573 A1 | 11/2016 | Osanai et al. | |
| 2016/0372796 A1 | 12/2016 | Nishihara | |
| 2017/0077487 A1* | 3/2017 | Coakley | H05K 1/118 |

OTHER PUBLICATIONS

Partial European Search Report dated May 25, 2020 for European Patent Application No. 17853975.5.
Extended European Search Report dated Aug. 28, 2020 for European Patent Application No. 17853975.5.

* cited by examiner

METHOD OF ASSEMBLY OF A BATTERY MODULE WITH UNIFIED CONNECTION ARRAY

CROSS-REFERENCE TO RELATED APPLICATION(S)

This application is a division of U.S. patent application Ser. No. 15/712,117, filed on Sep. 21, 2017, and titled "Unified Connection Array for Battery Module", which application claims the benefit under 35 U.S.C. 119(e) to U.S. Provisional Patent Application Ser. No. 62/398,957 titled "Unified Connection Array for Battery Module" and filed on Sep. 23, 2016, the entirety of which applications are incorporated herein by reference.

This application is related to co-pending U.S. Patent Application Publication Number 2018/0090797, filed on Sep. 21, 2017, and U.S. Patent Application Publication Number 2018/0090725, filed on Sep. 21, 2017, which are both hereby incorporated by reference in their entirety.

BACKGROUND

1. Field of the Invention

The present application relates to a battery system and components of a battery system used in heavy duty electric vehicles. More specifically, electric vehicles used in mining operations. A description of the electric power generation in an underground mining environment is provided in pending U.S. patent application Ser. No. 15/133,478, which is hereby incorporated in its entirety.

2. Description of the Related Art

Large, high voltage batteries are used in heavy duty applications, such as in electric and hybrid vehicles used in underground mining. These batteries often include multiple battery modules each containing a set of individual battery cells. A description of this type of battery module system is provided in co-pending U.S. patent application Ser. No. 14/494,133, which is hereby incorporated in its entirety. A description of a battery module maintenance system is provided in co-pending U.S. patent application Ser. No. 14/721,726 which is also hereby incorporated in its entirety.

Battery systems include components that can require servicing or replacement. Some battery systems include multiple wires that may be entangled and confusing to a service person causing increased costs for repair and increased downtime on machines that utilize the battery system. Therefore, there is a need in the art for a battery system that is easier to repair, requires less sophisticated equipment, and has a reduced offline time for repairs.

SUMMARY

In one aspect, the present disclosure is directed to a flexible connector for use in an electrical system. The flexible connector includes a central spine that includes a plurality of wires. The flexible connector also includes a first arm that extends substantially perpendicular from the central spine and at least a first wire of the plurality of wires is disposed on the first arm. Further a first pad is attached to the first arm and a length of the first pad is greater than a width of the first arm. The first pad is substantially parallel to the central spine. Further, a first monitor is attached to the first pad and the first wire is attached to the first monitor. Additionally, the width of the first arm is substantially greater than a thickness of the connector.

In another aspect, the present disclosure is directed to a flexible connector used in a battery monitoring system. The flexible connector includes a central spine that includes a plurality of electrical connectors. The central spine includes a spine end portion configured to attach to the battery monitoring system. Further, a plurality of pads are spaced from the central spine, and at least one of the plurality of electrical connectors extends to the plurality of pads. Additionally a plurality of monitors are associated with the plurality of pads and the plurality of monitors are connected to the plurality of electrical connectors. Further a width of one of the plurality of pads is substantially greater than a thickness of the flexible connector.

In another aspect, the present disclosure is directed to a method of assembly of a battery component. The method includes providing a cover assembly. The method further includes providing a cover with a lower surface and an opposite upper surface. Then the method includes placing a flexible connector along the lower surface of the cover such that an upper surface of the flexible connector is adjacent to the lower surface of the cover and a lower surface of the flexible connector is opposite of the upper surface of the flexible connector. Further, the method includes placing a plurality of busbars adjacent to the lower surface of the flexible connector such that an upper surface of the plurality of busbars contacts the lower surface of the flexible connector. Then the method includes securing the plurality of busbars to a portion of the cover. Finally, the method includes attaching the cover assembly to a battery module.

Other systems, methods, features and advantages of the invention will be, or will become, apparent to one of ordinary skill in the art upon examination of the following figures and detailed description. It is intended that all such additional systems, methods, features and advantages be included within this description and this summary, be within the scope of the invention, and be protected by the following claims.

BRIEF DESCRIPTION OF THE DRAWINGS

The embodiments can be better understood with reference to the following drawings and description. The drawings are schematic and, therefore, the components in the figures are not necessarily to scale, emphasis instead being placed upon illustrating the principles of the embodiment. Moreover, in the figures, like reference numerals designate corresponding parts throughout the different views.

DETAILED DESCRIPTION

Figure 1:
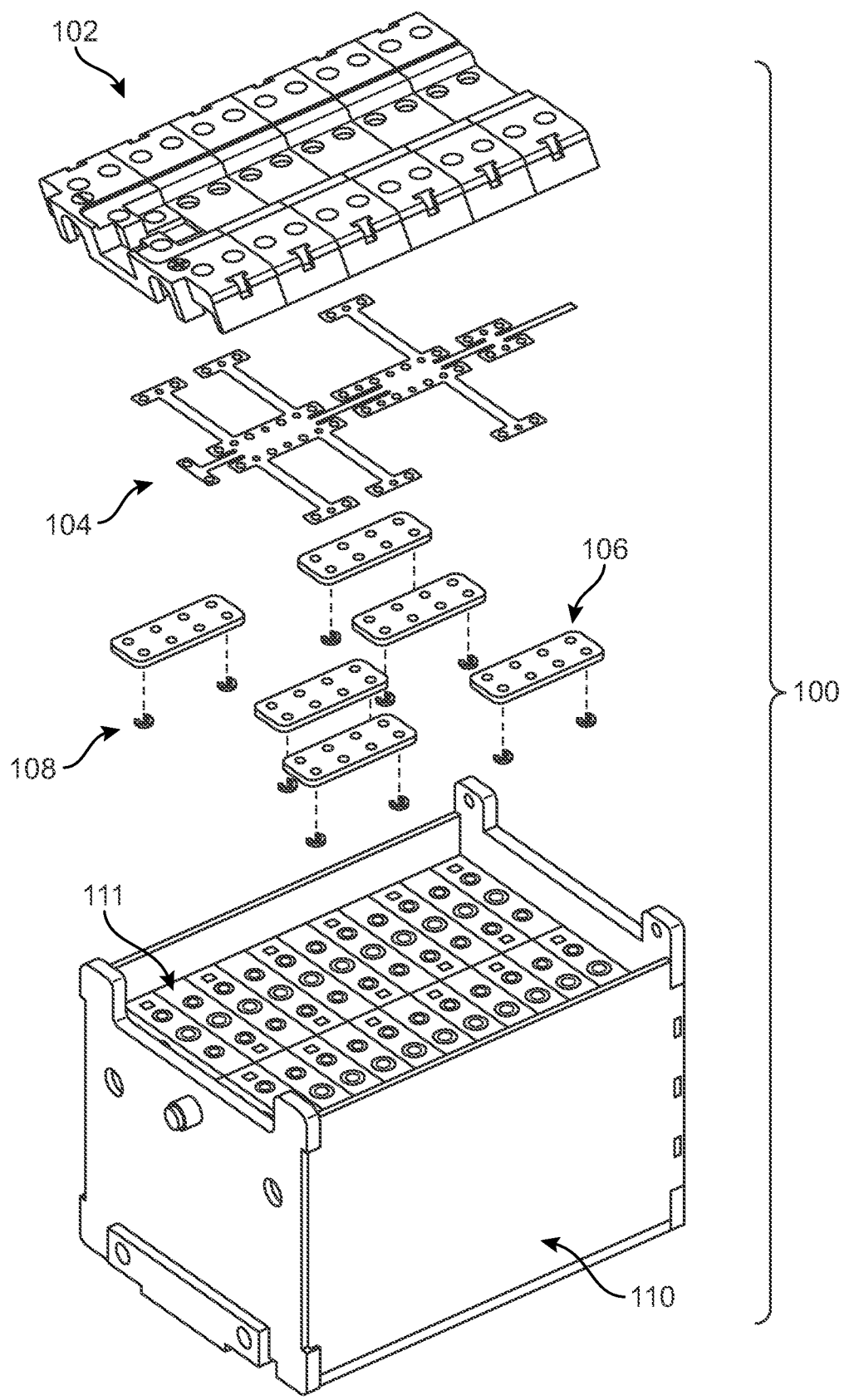
FIG. 1 is an exploded isometric view of an embodiment of a battery assembly.

FIG. 1 depicts an exploded view of components of a battery assembly. As shown battery assembly 100 includes cover 102, flexible connector 104, plurality of busbars 106, plurality of securement clips 108, and battery module 110. Battery module 110 may include a plurality of battery cells 111 for storing electrical energy. Flexible connector 104, plurality of busbars 106, and securement clips 108 may all be secured or attached to cover 102. After attachment to cover 102, the cover assembly may then be attached to battery module 110.

Each battery cell of plurality of battery cells 111 may be connected to each other by plurality of busbars 106 in various configurations. The busbars may transfer electrical power to and from various cells to produce a particular voltage and amperage to be sent to an electric motor or other electric device. The cells of plurality of battery cells 111 may sometimes discharge power at different rates from other cells of plurality of battery cells 111. Monitors, such as a thermistor, may be placed adjacent to plurality of busbars 106 in order to determine if any of the cells are malfunctioning or if the cells may require service. Further, if a monitor determines that a cell is discharging at a different rate than an adjacent cell, the monitors may be able to balance the cells by discharging additional power from the cells in order to balance each of the cells of plurality of battery cells 111. In some embodiments, the monitors may be in the form of printed circuit boards. In some embodiments, the printed circuit boards may be utilized to balance the voltage through each of the battery cells. In turn, by balancing the voltage in the battery cells, the voltage at each pad of plurality of pads 120 may also be balanced.

Some monitors may be attached to a processing unit on each of the battery cells such that each battery cell is monitored by a separate computer processing unit. In other cases, monitors may send data to a central processing unit that receives data from the various monitors and processes the information from all of the various monitors on the plurality of battery cells 111. When using a centralized battery processing unit, various wires or cords may connect each of the monitors to the centralized battery processing unit. When multiple battery cells are being monitored the number of wires increases and can cause a confusing array of wires. These wires may be easily caught on external objects or broken when servicing the battery module. Organizing the wires into a single neat, organized, and simple connector may allow for easier servicing of battery modules. For example, if flexible connector 104 were to break or malfunction, rather than determining where the break or malfunction is located, a new flexible connector may be utilized and easily incorporated into battery assembly 100.

The connector may be provided by the manufacturer of the battery assembly so that consistency in service and dependability is maintained. Further, the quality of the battery assembly may be maintained by utilizing a connector that organizes the wires that extend to battery cells within the battery module. By utilizing a separate connector, risk of accidentally connecting incorrect wires to various components of battery assembly 100 may be reduced when compared to embodiments that do not utilize a separate connector.

Figure 2:
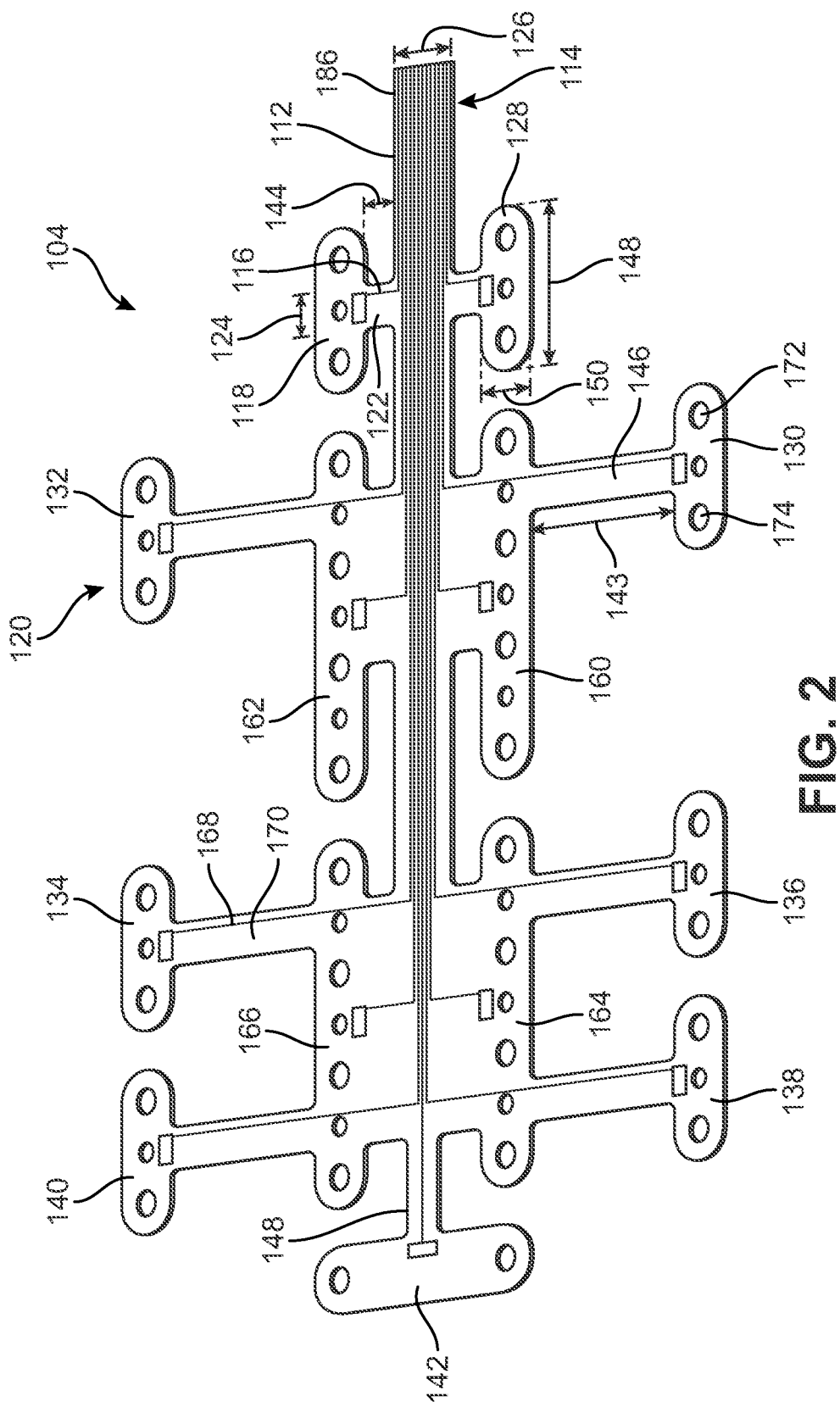
FIG. 2 is a schematic view of an embodiment of a flexible component.

Referring now to FIG. 2, flexible connector 104 is depicted. Flexible connector 104 may be a flexible circuit constructed of various materials. Flexible connector 104 may be formed of Kapton®, Pyralux®, Mylar®, a polyimide film or any suitable material. Additionally, flexible connector 104 may include copper wires or other wires that run through a thin flexible sheet of flexible connector 104. The wires may be configured to transfer electrical signal to and from various locations within the flexible circuit. Additionally, flexible connector 104 may be formed of various other materials that are able to transfer electrical signal.

In some embodiments, flexible connector 104 may be a rigid flexible circuit or a flat flexible circuit. In other embodiments, flexible connector 104 may be a combination of a flat flexible circuit and a rigid flexible circuit. Generally, a flexible circuit includes an electrical conducting material that is surrounded by an insulating material. In other embodiments, a portion of the electrical conducting material may be exposed. A rigid flexible circuit may include circuit boards that are located either internally, externally or both internally and externally of the rigid flexible circuit. A flat flexible circuit may include circuits that are located within the flax flexible circuit. That is, a flat flexible circuit may include copper, tin, aluminum, or any other material that is suitable to transfer electrical signal. Additionally, both rigid flexible circuits and flat flexible circuits may include portions that are configured to bend or twist without breaking.

In some embodiments, a flexible circuit may include various portions that interconnect with each other. As shown, flexible connector 104 includes central spine 112. Central spine 112 includes plurality of electrical connectors 114. In some embodiments, central spine 112 may be the area of flexible connector 104 through which plurality of electrical connectors 114 pass. In some embodiments, plurality of electrical connectors 114 may comprise wires, or sheets of electrically conductive material. In some embodiments plurality of electrical connectors 114 may be formed of copper, tin, acrylic or any other suitable material for transferring electrical data or energy.

Plurality of electrical connectors 114 may be encapsulate in Kapton®, Pyralux®, Mylar® or any other suitable material. In some embodiments, plurality of electrical connectors 114 may be encapsulated by an insulating material. In other embodiments, portions of plurality of electrical connectors 114 may be exposed. For example, in some embodiments, plurality of electrical connectors 114 may be along a first side of flexible connector 104 and be covered or layered with an insulating material along the opposite second side of flexible connector 104. In other embodiments, portions of the connectors of plurality of electrical connectors 114 may extend out of the insulating material to connect to various electrical components.

In some embodiments, a flexible connector may provide a unified array of electrical connections. As depicted throughout this detailed description, flexible connector 104 may be a single unitary item that transports electrical power, data, and information to and from various portions of battery assembly 100. The unified nature of flexible connector 104 allows for easier replacement and serviceability when compared to embodiments that do not include a unified connection array such as flexible connector 104. Although shown as a one-piece array, in some embodiments various flexible connectors may be utilized. For example, in a large battery module with many cells, multiple arrays or flexible connectors may be utilized in conjunction with each other. Additionally, in some embodiments, flexible connectors may be connected to each other to extend across large battery cells or large quantities of battery cells.

In some embodiments, the electrical connectors of flexible connector 104 may extend from central spine 112 in various directions. As depicted in FIG. 2, first wire 116 extends to first spaced pad 118 of plurality of pads 120 to electrically connect first spaced pad 118 to central spine 112. As shown, first wire 116 is positioned within first arm 122. First arm 122 may extend substantially perpendicularly from central spine 112. Additionally, in some embodiments, width 124 of first arm 122 may be greater than width 126 of central spine 122. By reducing the width of first arm 122 compared to central spine 112 less material may be required to form flexible conductor 104. Additionally, as shown in FIG. 2, although shown including a single wire, it should be recognized that multiple wires may be located within or on first arm 122. As depicted, the thickness of flexible connector 104 is substantially less than the width or length of flexible connector 104. This may allow for multiple wires to be located within flexible connector 104 without occupying unnecessary space. Further, the thickness of flexible connector 104 may be substantially similar to the thickness of the wires or electrical conductive material within flexible connector 104.

In some embodiments, additional material may be utilized in various arms of flexible connector 104. As shown in FIG. 2, and discussed above, first arm 122 may be less wide that central spine 112. Although first arm 122 may be less wide, first arm 122 may include additional insulating material to provide structure support between central spine 112 and first spaced pad 118. That is, the entire width of first arm 122 may not be encumbered by wires. Further, the spacing between wire on or in first arm 122 may be greater than the spacing of wires on or within central spine 112. Although first arm 122 may be less wide and still accommodate any required wires, the width of first arm 122 may be larger per wire when compared to central spine 112. By increasing the width per wire of first arm 122 the strength of first arm 122 may be increased such that the wires within first arm 116 are strengthened to prevent breaking, crimping, or tearing of: wires within first arm 116 or first arm 116 itself.

In some embodiments, flexible connector 104 may include multiple pads. As shown, plurality of pads 120 includes second spaced pad 128, third spaced pad 130, fourth spaced pad 132, fifth spaced pad 134, sixth spaced pad 136, seventh spaced pad 138, eighth spaced pad 140, and ninth spaced pad 142 in addition to first spaced pad 118. As shown, each of the pads includes an arm that attaches the pad toward the central spine. Each of the arms may be similarly designed to first arm 116 in regard to construction and width. In some embodiments, however, the length of the arms connecting the various pads toward central spine 112 may differ. For example, length 143 of second arm 146 may be greater than length 144 of first arm 116. The lengths of the arms may be changed in order to position the pads at various positions within the battery assembly. As discussed with regard to first spaced pad 118, wires may pass from central spine 112 to each of the pads of plurality of pads 120. Further, the wires may connect to various monitors such as thermistors or voltage monitors.

In some embodiments, arms may extend from either side of central spine 112. As shown, second arm 146 extends from a first side of central spine 112 and the arm that connectors to fourth spaced pad 132 extends from a second side of central spine 112. Further, in some embodiments, second arm 146 may be substantially parallel to the arm that extends to fourth spaced pad 132. Further, second arm 146 may be aligned laterally with the arm of fourth spaced pad 132. In other embodiments, the arms that connect to the various pads be unaligned or not parallel. Further, some arms may be parallel but not aligned.

In some embodiments, flexible connector 104 may be symmetric about a particular axis. As shown in FIG. 2, flexible connector 104 may be symmetric about a longitudinal axis of central spine 112. In other embodiments, various arms may extend at angles such that flexible connector 104 is not symmetric about an axis. Further, in some embodiments, arms may be lengthened or shortened such that flexible connector 104 is not symmetric about a particular axis.

As shown in FIG. 2, the pads are generally oriented along the same direction. For example, second spaced pad 128 is longer than second spaced pad 128 is wide. That is, length 148 of second spaced pad 128 is greater than width 150 of second spaced pad 128. The length of second spaced pad 128 may be substantially aligned with the length of central spine 112. Additionally, most of the pads of plurality of pads 120 are oriented such that the length of the pads is substantially aligned with the length of central spine 112. Additionally, in this configuration, many of the pads are parallel to central spine 112. Further, in this configuration the arms that connect to each of the pads are substantially perpendicular to central spine 112. In this configuration, the pads may be spaced from central spine 112 while also permitting the pads of plurality of pads 120 to connect to electrical components that may be oriented in a similar direction or spaced from central spine 112.

In some embodiments, various pads of plurality of pads 120 may be oriented at different angles. For example, as shown in FIG. 2, ninth spaced pad 142 is oriented at a different angle with respect to central spine 112 than the other pads of plurality of pads 120. As shown, ninth arm 148 of flexible connector 104 is substantially parallel with central spine 112. This is in contrast to the first through eighth arms of flexible connector 104. Additionally, ninth arm 148 as shown is substantially aligned with central spine 112. Further, ninth spaced pad 142 may be substantially perpendicular to ninth arm 148. Therefore, in some embodiments, ninth spaced pad 142 may be substantially perpendicular to the first through eighth spaced pads of plurality of pads 120. In this configuration, ninth spaced pad 142 may be utilized to connect various electrical components that are oriented in a different configuration from other electrical components. In some embodiments, ninth spaced pad 142 may connect various cells of battery module 110, for example.

In some embodiments, plurality of pads 120 of flexible connector 104 may include interior connection pads. As shown in FIG. 2, flexible connector 104 includes first interior pad 160, second interior pad 162, third interior pad 164, and fourth interior pad 166. In some embodiments, interior pads may be located closer to central spine 112 than the other pads. In some embodiments, the interior pads may be located between various pads and central spine 112. For example, first interior pad 160 is located between third spaced pad 130 and central spine 112. As shown, each of the interior pads is longer than the other pads of plurality of pads 120. Further, each of the interior pads is connected to central spine 112 by an arm that is wider than the arm is long. In some embodiments the length of the interior pads may be used to connect various electrical components over a greater distance.

In some embodiments, the wires that extend to the various pads of plurality of pads 120 may pass through portions of interior pads. As shown in FIG. 2, wire 168 that extends through fifth arm 170 and connects to fifth spaced pad 134 may also extend through a portion of fourth interior pad 166. By configuring flexible connector 104 to accommodate wires running through the portions of interior pads, the amount of material used to form flexible connector 104 may be less than flexible connectors of other embodiments that re-route wires around the interior pads. Further, the size of flexible connector 104 may be able to be reduced by utilizing the configuration shown in FIG. 2 such that the wires are configured through the interior pads.

In some embodiments, the pads of plurality of pads 120 may include holes or apertures. In some embodiments, the holes or apertures may be used to secure the pads in particular locations with respect to battery assembly 100. In some embodiments, bolts or screws or other mating devices may be inserted through the holes of the pads of plurality of pads 120. For example, in some embodiments, bolts may be inserted through first aperture 172 and second aperture 174 of third spaced pad 130 to secure third spaced pad 130 to a particular area. Further, in other embodiments, the third spaced pad 130 may be placed over dowels or rods and then secured in place. That is, in some embodiments, the apertures in various pads may be placed over pre-defined dowels or pins that may then restrict the pads from translating laterally and longitudinally.

In some embodiments, various portions of flexible connector 104 may be thickened or reinforced. In some embodiments, the pads may be reinforced. By reinforcing the pads of plurality of pads 120 the pads of plurality of pads 120 may provide a stiffened surface to which other circuitry components may be attached. Further, by stiffening pads of plurality of pads 120, the pads may resist tearing, breaking or crimping.

In some embodiments pads of plurality of pads 120 may be configured to attach to printed circuit boards or other circuit boards. Further, in some embodiments, pads of plurality of pads 120 may be configured to receive other electrical components. For example, in some embodiments, components for measuring various parameters may be attached to plurality of pads 120. In some embodiments, components that measure temperature, voltage, amperage or other electrical parameters may be attached or secured to pads of plurality of pads 120.

Figure 3:
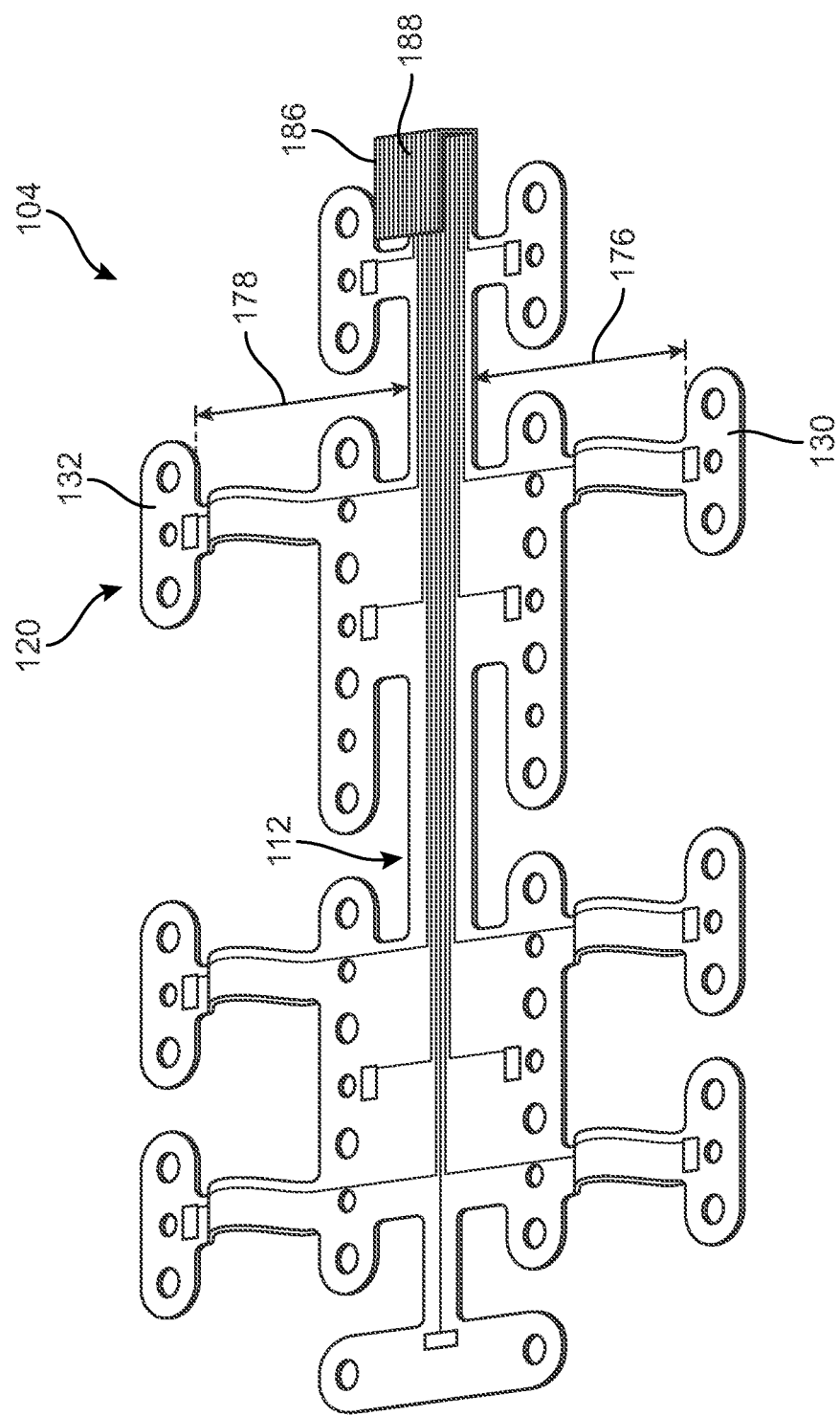
FIG. 3 is a view of an embodiment of the flexible component in a bent configuration.
Figure 4:
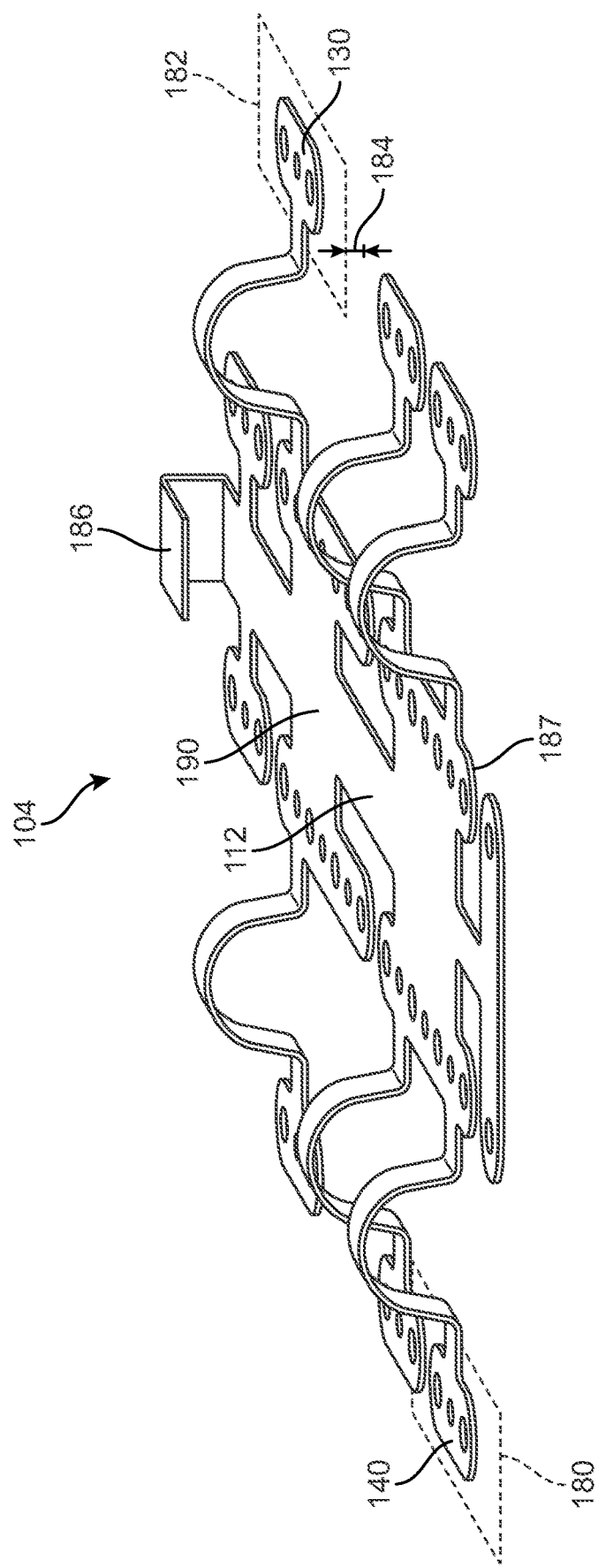
FIG. 4 is an isometric view of an embodiment of the flexible component in a bent configuration.

Referring now to FIGS. 3 and 4, flexible connector 104 is depicted in a bent or augmented position. As shown, the arms that extend between the spaced pads toward central spine 112 may be bent vertically such that portions of the arms are located in a different plane than the pads of plurality of pads 120. The flexible nature of the arms permit the spaced pads of plurality of connectors pads 120 to be moved closer or further away from central spine 112. For example, in some embodiments, the distance between central spine 112 and third spaced pad 130 may be different than the distance between central spine 112 and fourth spaced pad 132. For example, distance 176 between third spaced pad and central spine 112 may be greater than distance 178 between fourth spaced pad and central spine 112. Therefore, electrical components to which the pads may be connected may be spaced various distances from central spine 112. This may allow for central spine 112 to be used with various configurations of battery assemblies and busbars that have electrical components located in various positions. Further, FIGS. 3 and 4 depict that although flexible connector 104 may be bent and moved, the wires within flexible connector 104 may remain within or on flexible connector 104 such that the wires remain organized and untwisted when manipulating flexible connector 104.

Additionally, by utilizing flexible arms, the pads of plurality of pads 120 may be able to be located along different planes. Referring to FIG. 4, eighth spaced pad 140 may be located along horizontal plane 180. In some embodiments, central spine 112 may also be located along horizontal plane 180. Further, other portions of flexible connector 104 may be located within horizontal plane 180. Additionally, third spaced pad 130 may be located within horizontal plane 182. As shown, horizontal plane 182 may be substantially parallel to horizontal plane 180, however, horizontal plane 182 may be spaced distance 184 vertically above horizontal plane 180. Therefore, the pads of plurality of pads 120 may be spaced vertically so that various electrical components that are located in different horizontal planes may be attached by the same flexible connector. Additionally, although shown as parallel to each other, it is recognized that the pads may also be oriented in different planes to connect to various electrical components that are located in different planes.

In some embodiments, portions of flexible connector 104 may be bent to connect flexible connector 104 to various components. As shown in FIG. 2, spine end portion 186 is in a flat or planar configuration. In FIGS. 3 and 4, however, spine end portion 186 has been rotated such that the orientation of first surface 188 of spine end portion 186 is facing in the same direction as upper surface 190 of flexible connector 104. Therefore, first surface 188 is facing in an opposite direction in FIGS. 3 and 4 when compared to the orientation of first surface 188 shown in FIG. 2. In this configuration therefore, components may be located vertically above flexible connector 104 and still be electrically connected to flexible connector 104. Although first surface 188 may be part of lower surface 187 of flexible connector 104, first surface 188 may be oriented in substantially the same direction as upper surface 190 of flexible connector 104 in this configuration.

Figure 5:
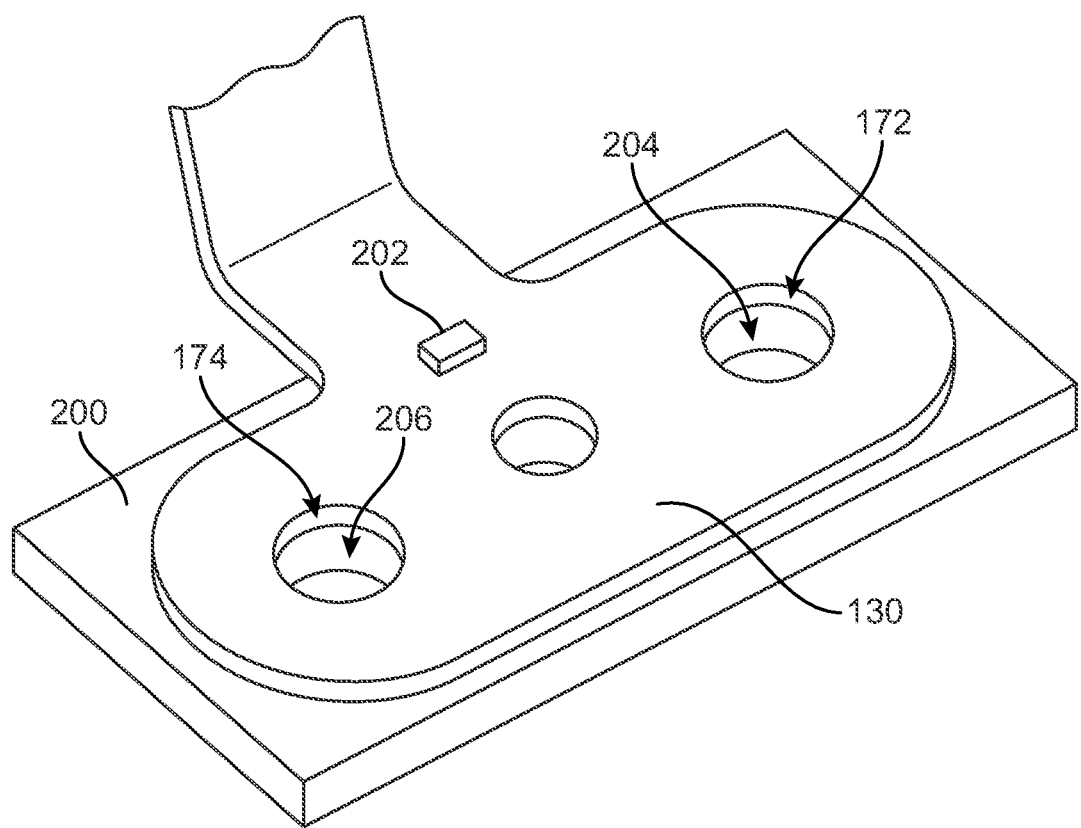
FIG. 5 is an enlarged view of an embodiment of a pad of the flexible component.

Referring now to FIG. 5, in some embodiments, plurality of pads 120 may be associated with printed circuit boards or chips. Printed circuit boards may be soldered, glued, bolted or otherwise secured to pads of flexible connector 104. As depicted in FIG. 5, third spaced pad 130 may be connected to printed circuit board 200. Printed circuit board 200 may have electrical connections between printed circuit board 200 and third spaced pad 130. That is, printed circuit board 200 may be connected to the various wires that extend to third spaced pad 130 and through flexible connector 104. Although shown with respect to third spaced pad 130, a printed circuit board could also be associated with any or all of the pads of plurality of pads 120. Further, for ease of viewing and description, the various embodiments depicted in this detailed description may not depict printed circuit boards as being attached to various pads, however, printed circuit boards may be attached to the pads of plurality of pads 120.

In some embodiments, information regarding plurality of battery cells 111 or other electrical components of battery assembly 100 may be received through a printed circuit board. In some embodiments, a printed circuit board may be able to determine the temperature, voltage, amperage, resistance, power, or other variables from an electrical component. For example, in some embodiments, printed circuit board 200 may be configured to determine the voltage of a busbar or other electrical component. The information regarding the voltage may be relayed through flexible connector 104 and to a central processing unit. The central processing unit may then determine whether the voltage is within an acceptable range. Additionally, the printed circuit boards may be able to determine the voltage across a busbar. If the voltage is determine to be different across busbars, power may be discharged through the printed circuit board in order to maintain substantially similar levels of voltage or other parameters between cells or busbars. Further, by balancing the busbars and cells, the voltage or power or other parameter being monitored may be balanced at the pads of plurality of pads 120.

In some embodiments, other separate electrical components may be secured to a pad. As shown in FIG. 5, thermistor 202 is secured to third spaced pad 130. Thermistor 202 may be soldered to third spaced pad 130 and may also be attached to the wires that extend through flexible connector 104 and to third spaced pad 130. Thermistor 202 may determine the temperature of third spaced pad 130 and then relay the information to a central processing unit. Further, thermistor 202 may also be located within printed circuit board 200. Additionally thermistor 202 may be located on a bottom surface of third spaced pad 130 and/or a top surface of third spaced pad 130. Additionally, although shown at a particular location, thermistor 202 may be located at various locations throughout flexible connector 104. Thermistors and printed circuit boards or other monitoring devices may be associated with any or all of the pads of plurality of pads 120. Additionally, monitors may be placed throughout flexible connector 104 to determine information regarding flexible connector 104 or components to which flexible connector 104 is connected.

In some embodiments, printed circuit boards may include holes or apertures that align with the holes or apertures of various pads of plurality of pads 120. As shown in FIG. 5, printed circuit board 200 includes first aperture 204 and second aperture 206. First aperture 204 of printed circuit board 200 may align with first aperture 172 of third spaced pad 130. Further, second aperture 206 may align with second aperture 174 of third spaced pad 130. In some embodiments, the apertures may align such that a bolt, screw or other fastening device may extend through both third spaced pad 130 as well as printed circuit board 200. Further, both third spaced pad 130 as well as printed circuit board 200 may include additional apertures to align each component with each other for attachment.

Figure 6:
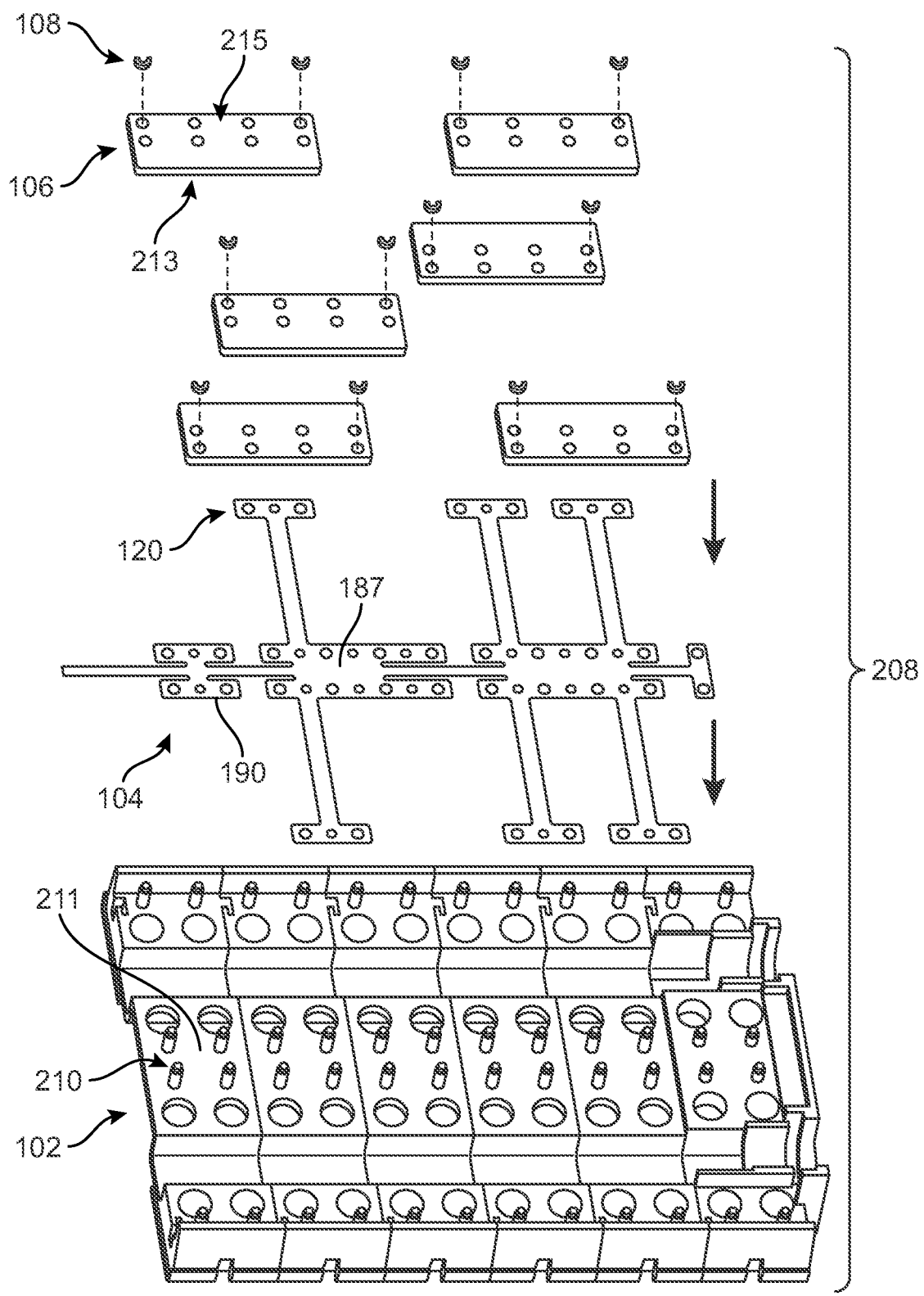
FIG. 6 is an exploded bottom view of an embodiment of a cover assembly.

Referring now to FIG. 6, the components of a cover assembly are depicted in an exploded view. As shown, cover assembly 208 includes cover 102, flexible connector 104, plurality of busbars 106, and securement clips 108. Securement clips 108 may include C-shaped clips, and may also include nuts or other engagement device to secure the busbars. Plurality of busbars 106 may include apertures that may align with the apertures in the pads of plurality of pads 120 as well as circuit boards (not shown for clarity).

Figure 7:
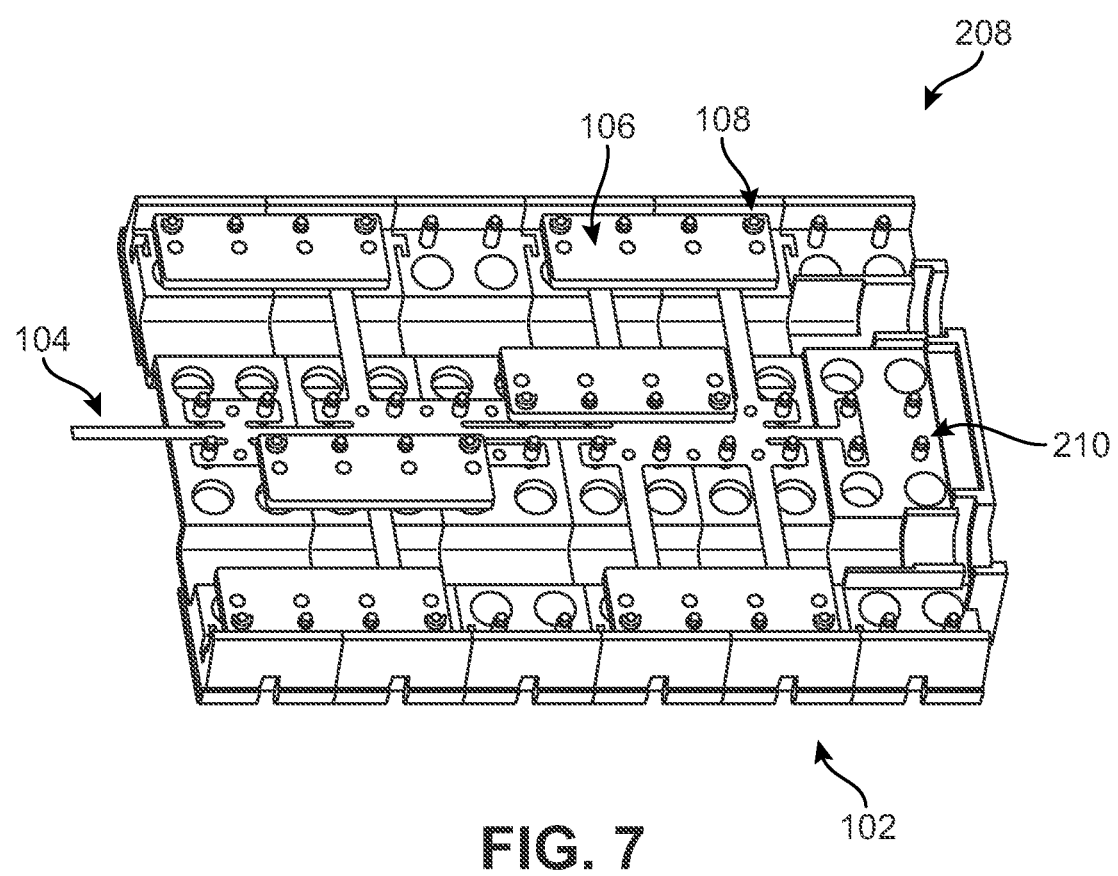
FIG. 7 is an assembly bottom view of an embodiment of a cover assembly.

In some embodiments, a cover may include extensions for accepting and aligning various components of cover assembly 208. As shown, lower surface 211 of cover 102 includes plurality of extensions 210. As shown in FIGS. 6 and 7, upper surface 190 of flexible connector 104 may be placed against lower surface 211 of cover 102 such that the apertures of the pads of plurality of pads 120 extend around plurality of extensions 210. In other words, plurality of extensions 210 may pass through the apertures in the pads of plurality of pads 120 thereby restricting flexible connector 104 from translating laterally and longitudinally. As shown in FIG. 7, some pads of plurality of pads 120 may remain uncovered by busbars for ease of description and viewing. In other embodiments, each of the pads may be covered by a corresponding busbar.

After upper surface 190 of flexible connector 104 has been placed against lower surface 211 of cover 102, plurality of busbars 106 may be placed over plurality of extensions 210. As shown upper surface 213 of plurality of busbars 106 may be placed against lower surface 187 of flexible connector 104. That is, plurality of extensions 210 may now pass through both flexible connector 104 and busbars of plurality of busbars 106. In this configuration, plurality of busbars 106 may be located adjacent to the pads of plurality of pads 120. That is, flexible connector 104 may be located between plurality of busbars 106 and cover 102. In other embodiments, plurality of busbars 106 may abut lower surface 211 of cover 102. In still further embodiments, a portion of a busbar of plurality of busbars 106 may abut lower surface 187 of flexible connector 104 while another portion may abut lower surface 211 of cover 102. In other embodiments, the busbars may have different orientations such that some busbars abut pads of flexible connector 104 while other busbars do not abut pads of flexible connector 104 or other portions of flexible connector 104.

After busbars of plurality of busbars 106 are placed around plurality of extensions 210, securement clips 108 may be attached to the extensions of plurality of extensions 210. In some embodiments, securement clips 108 may press against lower surface 215 of the busbars of plurality of busbars 106. This pressure may cause busbars of plurality of busbars 106 to be firmly pressed against flexible connector 104 and also against cover 102. In some embodiments, pressing the pads of plurality of pads 120 to plurality of busbars 106 may create a connection between printed circuit boards and the bus bars that allows for printed circuit boards to receive information regarding the busbars and send the information to a central processing unit. In some embodiments, when cover assembly 208 is connected to battery module 110 a portion of plurality of extensions 210 may extend into the cells of plurality of battery cells 111. By allowing a portion of plurality of extensions 210 to extend into plurality of battery cells 111, plurality of busbars 106 may be able to be pressed against the surface of plurality of battery cells 111. This may decrease the space necessary for the components within cover assembly 208 while also permitting a sufficient connection between plurality of battery cells 111 and plurality of busbars 106.

In some embodiments, cover assembly 208 may be configured to be easily replaceable. Each of the components of cover assembly 208 may be secured to cover 102 so that when servicing, cover assembly 208 along with each of the components of cover assembly 208, may be removed from battery module 110 as a one-piece component. Once removed, as shown in FIGS. 6 and 7 and discussed previously, each component may be slid over extensions of plurality of extensions 210. If a component breaks or needs to be replaced, securement clips 108 may be removed to allow the busbars and flexible connector 104 to be inspected, repaired, or replaced easily if necessary. Further, by placing the busbars and other electrical components in cover assembly 208, the likelihood of a short through battery module 110 may be reduced. For example, plurality of busbars 106 may be removed from battery module 110 while still in cover assembly 208. Therefore, the likelihood of a busbar rotating during service and crossing leads of battery module 110 may be reduced because plurality of busbars 106 may be moved away from the leads of battery module 110 for servicing.

Figure 8:
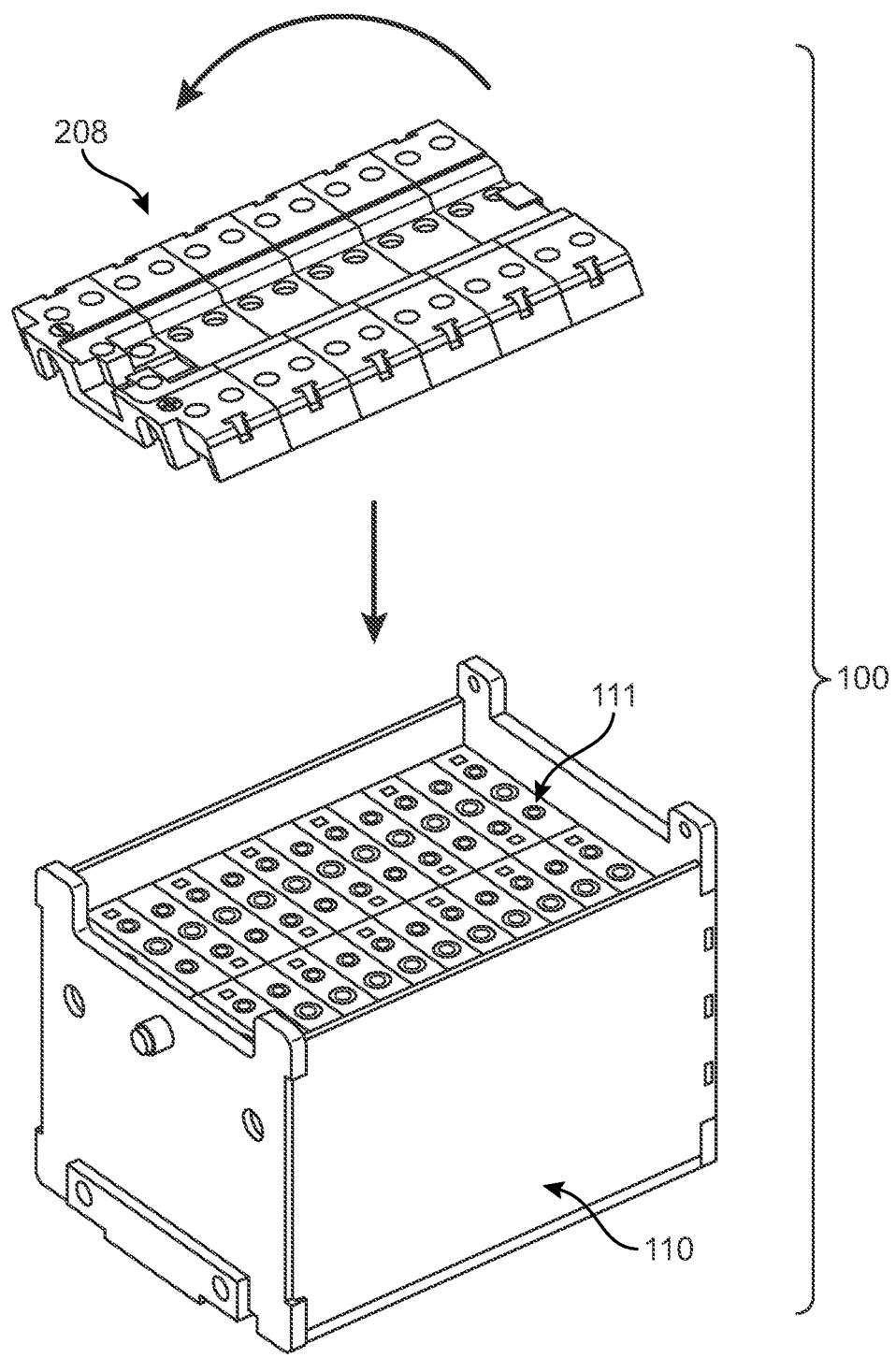
FIG. 8 is an exploded view of an embodiment of a battery module and a cover assembly.
Figure 9:
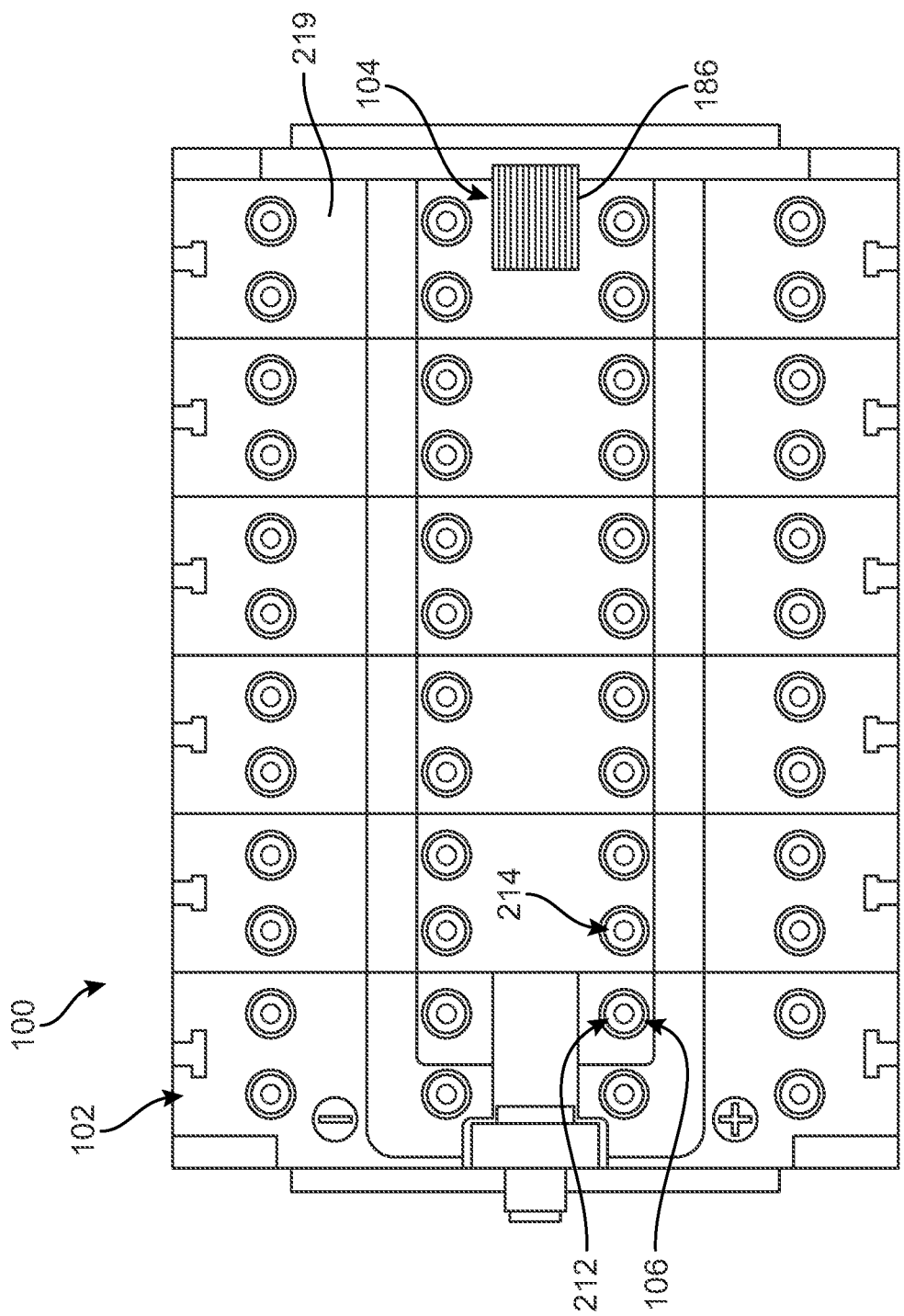
FIG. 9 is a top view of an embodiment of a battery assembly.
Figure 10:
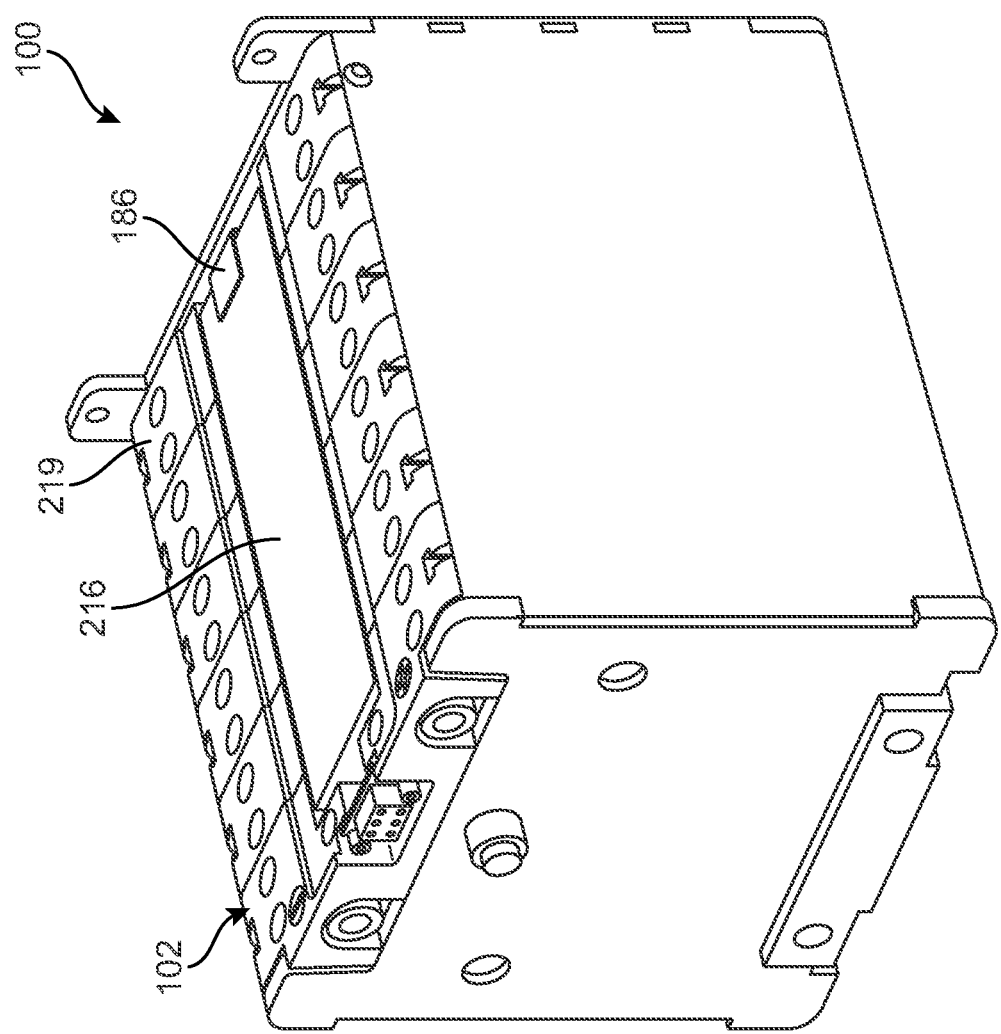
FIG. 10 is an isometric view of an embodiment of a battery assembly including a battery monitoring system.

Referring now to FIGS. 8-10 battery assembly 100 is shown in various configurations. As shown in FIG. 8, cover assembly 208 has been flipped over for assembly onto battery module 110. Because cover assembly 208 includes various electrical components, the cells of plurality of battery cells 111 of battery module 110 may remain largely free of additional electrical connections. By incorporating many of the electrical components in cover assembly 208 portions of battery assembly 100 may be removed from battery assembly 100 to service various components. For example, battery module 110 may be able to be left in a mine or other area while cover assembly 208 is removed for repair. This may make repairs easier and more cost effective that in battery assemblies with different configurations.

Referring particularly to FIG. 9, a top view of battery assembly 100 is depicted. As shown, cover assembly 208 has been attached to battery module 110. In some embodiments, cover 102 of cover assembly 208 may include a plurality of apertures. For example, cover 102 includes plurality of apertures 212. Plurality of apertures 212 may align with apertures located on plurality of busbars 106. That is, plurality of apertures 212 may align with apertures of plurality of busbars 106 that do not include plurality of extensions 210. In some embodiments, a plurality of removable securement devices may be utilized to secure cover 102 to battery module 110. For example, plurality of securement devices 214 may be inserted through plurality of apertures 212 of cover 102 and through the apertures of plurality of busbars 106 and into battery module 110. In some embodiments, plurality of securement devices 214 may include bolts, screws, or other securement devices. In this configuration, busbars of plurality of busbars 106 as well as cover assembly 208 may be securely fastened to battery module 110. Further, removable of cover assembly 208 may be accomplished by simply removing plurality of securement devices 214 or other securement mechanisms.

In some embodiments, portions of flexible connector 104 may extend along a side surface of cover 102 and around cover 102. As shown, spine end portion 186 of flexible connector 104 extends around cover 102. Therefore, a portion of flexible connector 104 is located along lower surface 211 of cover 102 and a portion of flexible connector 104 is located adjacent to upper surface 219 of cover 102. Spine end portion 186 may be configured to be attachable to a computer module.

As shown in FIG. 10, battery assembly 100 further includes a battery monitoring system. Battery monitoring system 216 may include a computer processing unit that interprets information regarding battery module 110 to provide for efficient use of the energy stored within battery module 110. Battery monitoring system 216 may receive information from the circuit boards or other electrical components attached to flexible connector 104. Battery monitoring system 216 may then interpret the information and determine voltage differences between cells in battery module 110 or temperature of battery module 110. Once the information has been determined by battery monitoring system 216 battery monitoring system 216 may instruct various components that are attached to flexible connector 104 to begin modulating the voltage from each of the cells of battery module 110. That is, small variations between the battery cells of battery module 110 may be dissipated or removed through pads of flexible connector 104. Further, battery monitoring system 216 may send information to a graphical interface so that a user may view the information regarding the battery or cells.

Additionally, as shown in FIG. 10 spine end portion 186 extends from lower surface 211 of cover 102 to upper surface 219 of cover 102. As shown, spine end portion 186 may be attached to battery monitoring system 216. Therefore, battery monitoring system 216 may be electrically connected to the various portions of flexible connector 104. Further, as shown in FIG. 10, battery monitoring system 216 may also be mounted along upper surface 219 of cover 102. By mounting battery monitoring system 216 on cover 102, battery monitoring system 216 may be easily accessible. Further, battery monitoring system 216 may be separated from other electrical components of battery module 110 by cover 102.

Figure 11:
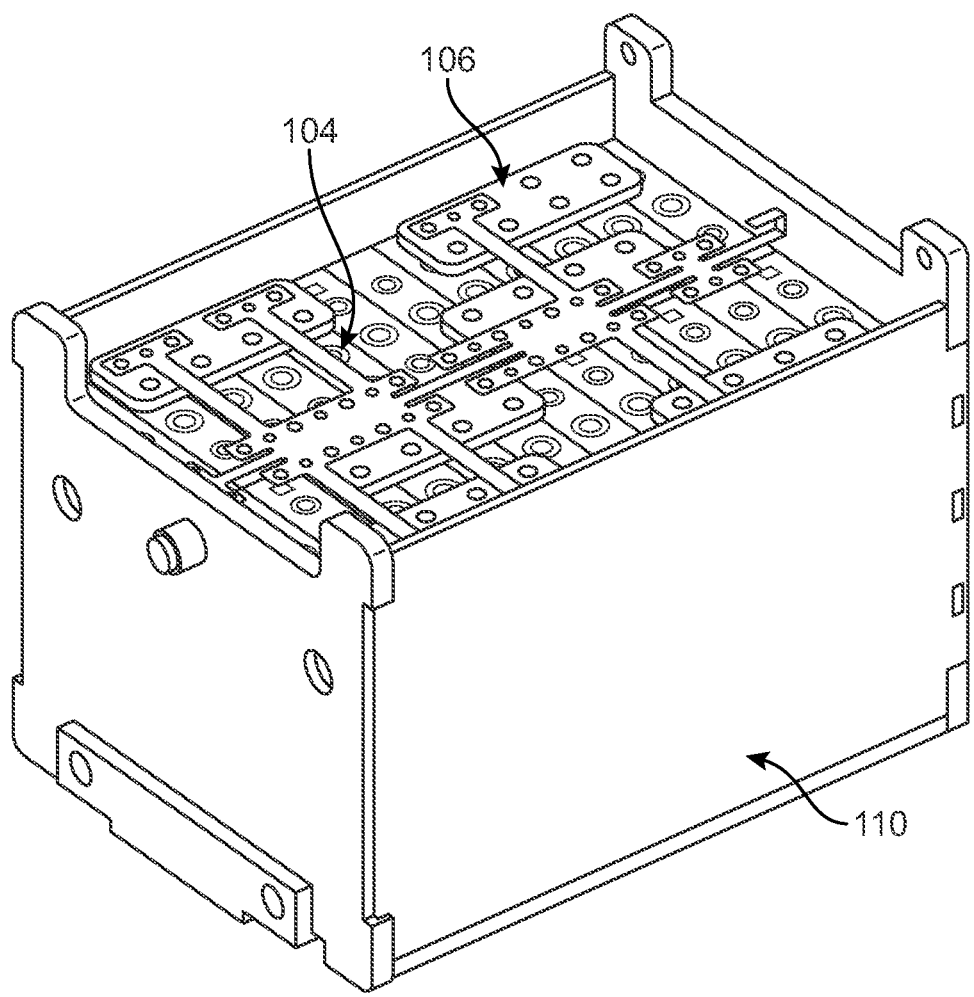
FIG. 11 is an isometric view of an embodiment of a battery assembly without a cover.

Referring now to FIG. 11, battery module 110, plurality of busbars 106 and flexible connector 104 are depicted without cover 102. Although plurality of busbars 106 and flexible connector 104 are mounted within cover 102, in FIG. 11, cover 102 has been removed for clarity. As shown, plurality of busbars 106 may extend across various cells of battery module 110. Plurality of busbars 106 may connect the cells in series or in parallel or any combination thereof. Further, flexible connector 104 is shown mounted on plurality of busbars 106. Flexible connector 104 may neatly and simply connect to the various busbars to relay information back to battery monitoring system 216.

By utilizing flexible connector 104 to connect various components and relay information to battery monitoring system 216 cover 102 may be able to be manufactured with a shorter depth. Because flexible connector 104 is substantially flat, additional space for connecting wires is not necessary. Further, by providing a one-piece flexible connector, replacement of the wires that connect the monitors to battery monitoring system may be simple and less time consuming that in embodiments that include various unbound wires. Further, by providing a flexible connector with a particular shape and layout the manufacturer may be able to maintain consistency and quality in the type of connectors used in battery assembly 100 by requiring a service person to obtain the required part from the manufacturer. This particular layout and construction may reduce incorrect wiring of battery assembly 100 or other human errors that arise when servicing battery assembly 100.

Figure 12:
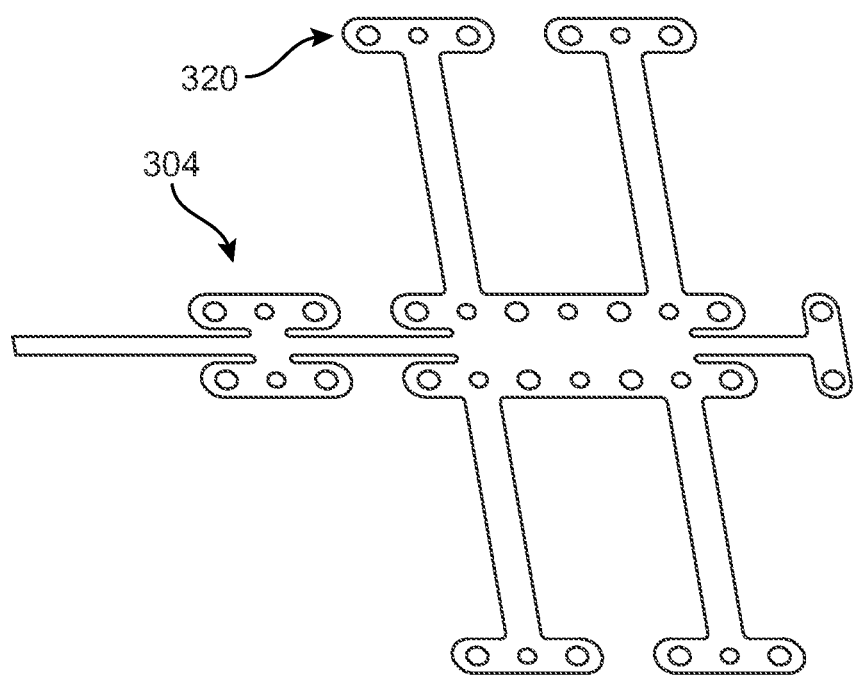
FIG. 12 is a schematic view of another embodiment of a flexible connector.
Figure 13:
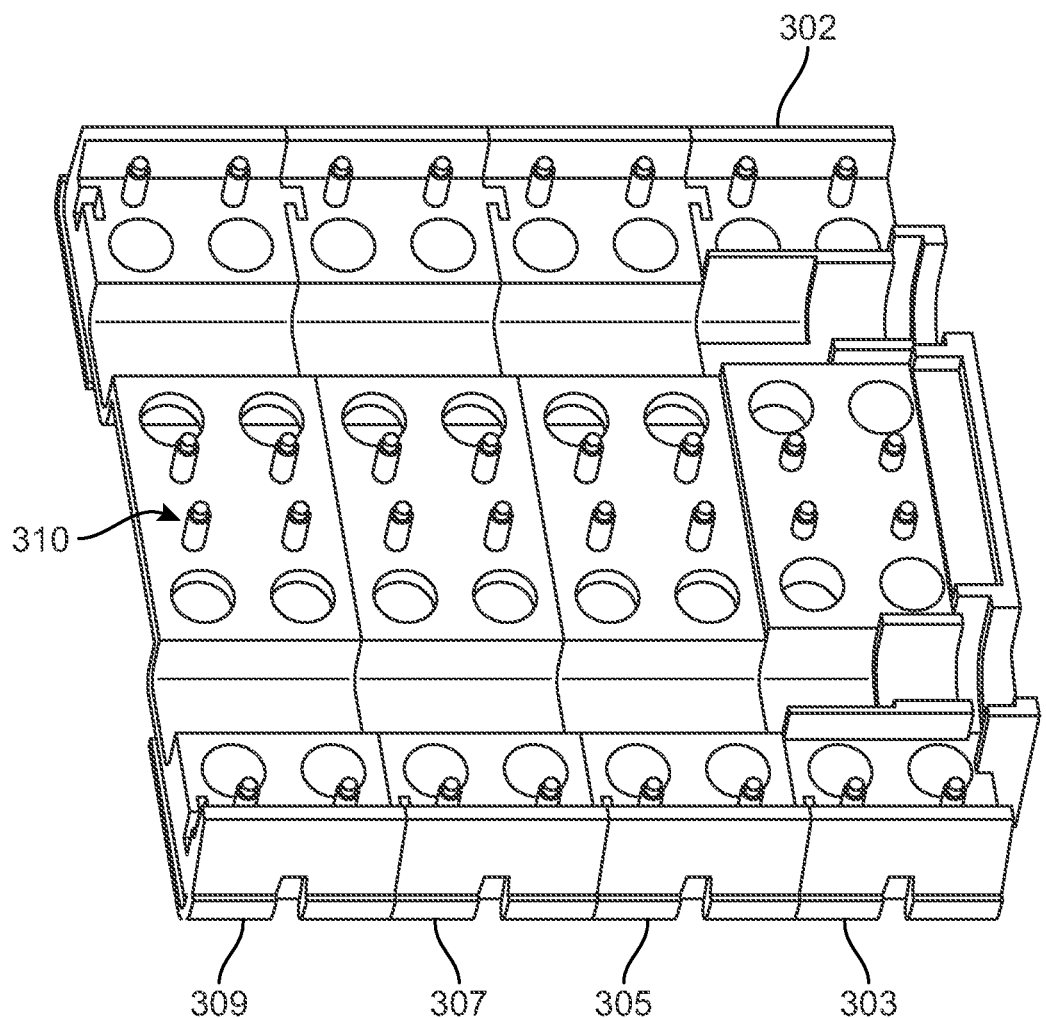
FIG. 13 is a bottom isometric view of another embodiment of a cover.
Figure 14:
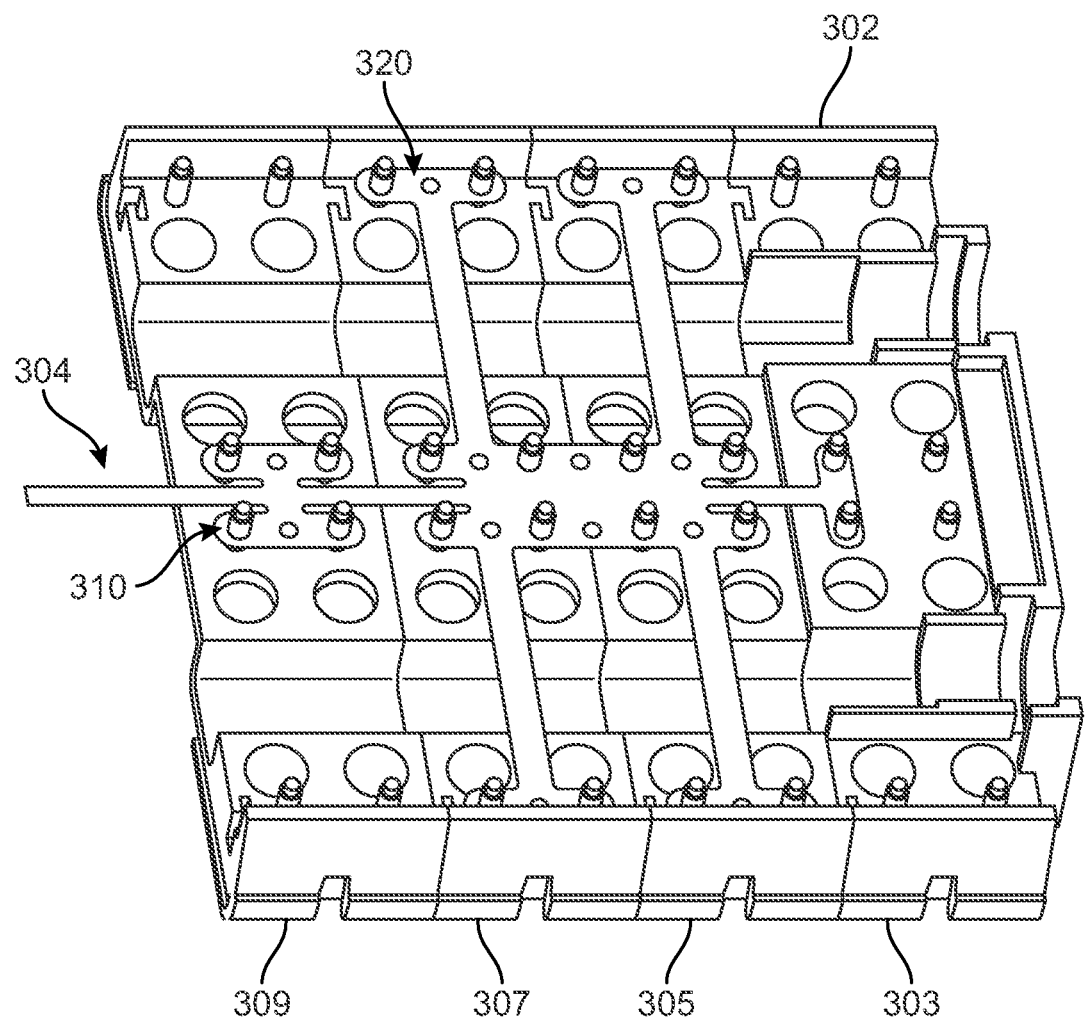
FIG. 14 is a bottom isometric view of the cover with a flexible connector.

Referring now to FIGS. 12-14, an alternate embodiment of a flexible connector is depicted. In some embodiments, various sizes of battery assemblies may be made for a customer. In some embodiments, the battery assemblies may be modular in order to allow the batteries to be larger or smaller and increase or decrease voltage or energy storage requirements. In order to connect accumulated data from various busbars of different sized battery assemblies, a flexible connector may be utilized. By using a flexible connector rather than loose wires, consistency in the readings received from various sensors located throughout the flexible connector may be increased when compared to other configurations because consistency in wire routing and thickness may be maintained. As shown in FIG. 12, flexible connector 304 does not include the same number of pads within plurality of connector pads 320 as plurality of pads 120 of flexible connector 104 as shown in FIG. 2. Flexible connector 304 may be configured to be utilized in conjunction with a smaller cover that is utilized for a smaller battery module. Although flexible connector 304 is shown as merely utilizing few pads, it should be recognized that the geometry of flexible connector 304 may be further changed. For example, the arms that extend from the central spine of flexible connector 304 may be shorter or longer depending on the application. In some embodiments, the electrical component to which the pads are configured to attach may be closer to or farther from the central spine of flexible connector 320. Flexible connector 304 may therefore be augmented in order to accommodate different geometries of covers and battery modules.

Referring particularly to FIG. 13, cover 302 is depicted. As shown, cover 302 includes four modules that may be added or removed. A modular cover is discussed in detail in Huff et al., U.S. Patent Application Publication Number 2018/0090725, which is incorporated by reference above. First module 303, second module 305, third module 307, and fourth module 309 may be secured together in order to form cover 302. In this configuration, cover 302 contains fewer modules that cover 102 and therefore is not as long as cover 102. Because cover 302 is shorter that cover 102, cover 302 may accept a smaller flexible connector. Cover 302 may generally be formed in the same manner as cover 102. That is, cover 302 may include a plurality of apertures as well as plurality of extensions 310. Further, plurality of extensions 310 may be configured to extend through corresponding apertures within flexible connector 304.

As shown in FIG. 14, flexible connector 304 has been inserted within cover 302 such that plurality of extensions 310 extend through corresponding apertures within flexible connector 304. Although shown without busbars in FIG. 14, busbars may be added in order to complete any electrical circuit in the same manner as described previously with respect to cover assembly 208.

While various embodiments have been described, the description is intended to be exemplary, rather than limiting and it will be apparent to those of ordinary skill in the art that many more embodiments and implementations are possible that are within the scope of the embodiments. Any feature of any embodiment may be used in combination with or substituted for any other feature or element in any other embodiment unless specifically restricted. Accordingly, the embodiments are not to be restricted except in light of the attached claims and their equivalents. Also, various modifications and changes may be made within the scope of the attached claims.

The invention claimed is:

1. A method of assembly of a battery component, comprising:
    providing a cover assembly including:
        providing a cover with a lower surface and an opposite upper surface;
        placing a flexible connector along the lower surface of the cover, such that an upper surface of the flexible connector is adjacent to the lower surface of the cover and a lower surface of the flexible connector is opposite of the upper surface of the flexible connector;
        placing a plurality of busbars adjacent to the lower surface of the flexible connector such that an upper surface of the plurality of busbars contacts the lower surface of the flexible connector;
        securing the plurality of busbars to a portion of the cover; and
    attaching the cover assembly to a battery module to form the battery component.

2. The method of assembly according to claim 1, wherein, prior to attaching the cover assembly to the battery module, the cover assembly is flipped such that the lower surface of the cover faces the battery module, and wherein the flexible connector and the plurality of busbars remain within the cover.

3. The method of assembly according to claim 1, wherein the lower surface of the cover includes a plurality of extensions, and wherein the plurality of extensions are positioned through a portion of the flexible connector and at least one of the plurality of busbars.

4. The method of assembly according to claim 3, wherein at least one securement clip is attached to at least one of the plurality of extensions such that the at least one securement clip is located adjacent to a lower surface of the at least one of the plurality of busbars.

5. The method of assembly according to claim 1, wherein the cover assembly is secured to the battery module using a plurality of removable securement devices, wherein at least one of the removable securement devices extends through an aperture in the cover and also through an aperture in at least one of the plurality of busbars.

6. The method of assembly according to claim 1, further comprising:
    attaching a battery monitoring system to the cover assembly; and
    connecting the flexible connector to the battery monitoring system.

7. The method of assembly according to claim 6, wherein a portion of the flexible connector extends around a side surface of the cover and connects to the battery monitoring system.

8. The method of assembly according to claim 7, wherein the flexible connector comprises a central spine including a spine end portion configured to attach to the battery monitoring system, the central spine extending around the side surface of the cover and connecting to the battery monitoring system.

9. A method of assembly of a battery component, comprising:
    providing a cover assembly comprising:
        providing a flexible connector comprising a central spine that includes a plurality of wires, a first arm extending substantially perpendicular from the central spine, at least a first wire of the plurality of wires disposed on the first arm, a first pad attached to the first arm, a length of the first pad being greater than a width of the first arm, wherein the first pad is substantially parallel to the central spine and wherein the width of the first arm is substantially greater than a thickness of the flexible connector;
        providing a cover having a lower surface and an opposite upper surface;
        placing an upper surface of the flexible connector adjacent to the lower surface of the cover;
        providing a plurality of busbars having a lower surface and an opposite upper surface;
        placing the upper surface of the plurality of busbars adjacent to a lower surface of the flexible connector; and
    attaching the cover assembly including the cover, the flexible connector, and the plurality of busbars to a battery module to form the battery assembly.

10. The method of assembly according to claim 9, further comprising:
    placing the plurality of busbars such that a portion of the upper surface of the plurality of busbars abuts the lower surface of the cover.

11. The method of assembly according to claim 9, wherein the first pad of the flexible connector includes a plurality of apertures; and
   wherein the method further comprises aligning apertures of the plurality of busbars with the plurality of apertures of the first pad of the flexible connector.

12. The method of assembly according to claim 11, wherein the lower surface of the cover includes a plurality of extensions; and
   wherein the method further comprises positioning the plurality of extensions through at least one of the plurality of apertures of the flexible connector and at least one aperture of the plurality of busbars.

13. The method of assembly according to claim 9, further comprising bending the first arm vertically such that a portion of the first arm is located in a different plane than the first pad.

14. The method of assembly according to claim 9, wherein the first arm is flexible so as to adjust a spacing of the first pad to be closer or further from the central spine.

15. The method of assembly according to claim 9, wherein the flexible connector further comprises:
   a second arm extending substantially perpendicular from the central spine, at least a second wire of the plurality of wires is disposed on the second arm, wherein a width of the second arm is greater than a length of the second arm;
   a second pad attached to the second arm, a length of the second pad being greater than the length of the first pad, and wherein the second pad is located closer to the central spine than the first pad.

16. A method of assembly of a battery component, comprising:
   providing a cover assembly including:
      providing a cover with a lower surface and an opposite upper surface, wherein the lower surface includes a plurality of extensions;
      placing a flexible connector having a lower surface and an opposite upper surface along the lower surface of the cover such that the upper surface of the flexible connector is adjacent to the lower surface of the cover;
      wherein the flexible connector includes a plurality of apertures and wherein the flexible connector is placed such that at least one of the plurality of apertures extends around at least one of the plurality of extensions on the lower surface of the cover;
      placing a plurality of busbars adjacent to the lower surface of the flexible connector such that an upper surface of the plurality of busbars contacts the lower surface of the flexible connector;
      wherein the plurality of busbars include apertures and wherein the plurality of busbars are placed such that at least one of the plurality of extensions on the lower surface of the cover extends through at least one aperture of the plurality of busbars; and
   attaching the cover assembly to a battery module to form the battery component.

17. The method of assembly according to claim 16, wherein the at least one of the plurality of extensions on the lower surface of the cover extends through both the at least one aperture of the plurality of busbars and the at least one of the plurality of apertures of the flexible connector.

18. The method of assembly according to claim 16, wherein the battery module comprises a plurality of battery cells; and
   wherein a portion of the plurality of extensions extend into one or more of the plurality of battery cells.

19. The method of assembly according to claim 18, wherein a lower surface of the plurality of busbars contacts one or more of the plurality of battery cells.

20. The method of assembly according to claim 16, wherein the cover assembly is removable from the battery module such that one or more of the plurality of busbars or the flexible connector may be replaced.

\* \* \* \* \*